(12) United States Patent
Ow et al.

(10) Patent No.: US 12,074,400 B1
(45) Date of Patent: Aug. 27, 2024

(54) SUBSTRATE DIMENSION ADAPTER

(71) Applicant: Unity Semiconductor, Montbonnot-Saint-Martin (FR)

(72) Inventors: Yueh Sheng Ow, Singapore (SG); Mayeul Durand de Gevigney, Montbonnot-Saint-Martin (FR); Christophe Isnard, Taipei (TW)

(73) Assignee: Unity Semiconductor, Montbonnot-Saint-Martin (FR)

( * ) Notice: Subject to any disclaimer, the term of this patent is extended or adjusted under 35 U.S.C. 154(b) by 0 days.

(21) Appl. No.: 18/630,700

(22) Filed: Apr. 9, 2024

(30) Foreign Application Priority Data

Jul. 3, 2023 (EP) ..................................... 23315266

(51) Int. Cl.
*H01R 31/06* (2006.01)
*H01R 12/71* (2011.01)

(52) U.S. Cl.
CPC ........... *H01R 31/06* (2013.01); *H01R 12/716* (2013.01)

(58) Field of Classification Search
CPC .............................. H01R 31/06; H01R 12/716
See application file for complete search history.

(56) References Cited

U.S. PATENT DOCUMENTS

| | | | | |
|---|---|---|---|---|
| 5,088,930 A | * | 2/1992 | Murphy | H05K 7/1023 439/70 |
| 6,402,546 B1 | * | 6/2002 | Groves | H02G 11/02 439/501 |
| 7,108,471 B2 | | 9/2006 | Osuga | |
| 11,348,269 B1 | * | 5/2022 | Ebrahimi Afrouzi | G01S 17/86 |
| 2003/0008550 A1 | * | 1/2003 | Tse | H02G 11/02 439/501 |
| 2007/0015375 A1 | * | 1/2007 | Weiss | H05K 1/141 439/66 |
| 2010/0134998 A1 | * | 6/2010 | Kiyota | H05K 3/301 361/808 |
| 2011/0044865 A1 | * | 2/2011 | Groisman | C12M 41/36 422/503 |
| 2014/0163664 A1 | * | 6/2014 | Goldsmith | A61B 17/0057 604/93.01 |
| 2017/0278729 A1 | * | 9/2017 | Hayashi | B08B 3/08 |
| 2018/0169907 A1 | * | 6/2018 | Burggraf | G03F 7/0002 |
| 2018/0284071 A1 | * | 10/2018 | Wright | G01N 29/069 |

(Continued)

FOREIGN PATENT DOCUMENTS

| | | |
|---|---|---|
| JP | 2001-068541 A | 3/2001 |
| JP | 2020-113574 A | 7/2020 |

*Primary Examiner* — Abdullah A Riyami
*Assistant Examiner* — Nelson R. Burgos-Guntin
(74) *Attorney, Agent, or Firm* — TraskBritt

(57) ABSTRACT

An adapter for retaining a wafer has a back side intended to be placed on, and to extend over, a first suction channel and a second suction channel disposed on a main face of a support. The adapter has a shallow recess disposed on the front side to receive the wafer, the shallow recess being shaped to the wafer size and having a flat base to contact a surface of the wafer. The adapter also includes a vacuum network extending through the adapter and comprising at least one through-passage connecting the adapter back side and the adapter front side, the through-passage opening out, on the front side, in the shallow recess. The through-passage intercepts, on the back side, the first suction channel of the support but not the second suction channel.

18 Claims, 3 Drawing Sheets

(56) References Cited

U.S. PATENT DOCUMENTS

| | | | | |
|---|---|---|---|---|
| 2023/0279487 A1* | 9/2023 | Almogy | ............... | C12Q 1/6869 |
| | | | | 435/6.1 |
| 2023/0311274 A1* | 10/2023 | Duescher | ............. | B24D 11/001 |
| | | | | 451/527 |
| 2023/0329916 A1* | 10/2023 | Seshadri | ............. | A61F 13/0203 |
| 2024/0124976 A1* | 4/2024 | Kubo | ................ | C23C 16/45529 |

\* cited by examiner

SUBSTRATE DIMENSION ADAPTER

CROSS-REFERENCE TO RELATED APPLICATIONS

This application claims the benefit of the filing date of European Patent Application Serial No. EP23315266.9, filed Jul. 3, 2023, for "Substrate Dimension Adapter," the entire disclosure of which is hereby incorporated herein in its entirety by this reference.

TECHNICAL FIELD

The present disclosure generally relates to a substrate dimension adapter.

BACKGROUND

The outer diameter of semiconductor wafers commonly used in the manufacture of semiconductor devices is typically 200 mm or 300 mm. Some materials, however, are not available in the form of wafers of such size. For instance, compound material or sapphire are only available in the form of wafers having an outer diameter of 150 mm or less. Semiconductor substrates can also have other shapes than circular wafers, such as rectangular or square panels or dies. To process wafers or substrates of different sizes or dimension with the same semiconductor processing equipment, it is necessary to change the transport system and support of the equipment to the appropriate size of the wafer, which is time consuming.

Documents JP2020113574, U.S. Pat. No. 7,108,471 or JP2001068541A propose different types of wafer size adapters. Such an adapter has an outer size (overall shape and dimension) adapted to the semiconductor processing equipment and is configured to receive, on its front side, the wafer to be processed. By using a wafer size adapter, it is not necessary to change the supports of the manufacturing line equipment to the actual size of the wafer to be processed.

According to the prior art, the adapter comprises a through-passage connecting the adapter back side and the adapter front side. The through-passage opens out, on the front side, under the wafer under process. When the wafer under process is placed onto the adapter front side while the adapter back side is positioned against a support, the trough passage is aligned with one suction (or vacuum) channel of the support, and the wafer under process is pressed against the adapter, which is itself pressed against the support.

If, however, the contact between the wafer to be processed and the adapter is lost or incomplete, the vacuum force holding the wafer to the adapter is greatly reduced. In such a situation, not only is the wafer weakly held to the adapter, but the adapter itself is not properly held onto the support. There is a risk that both the wafer under process and the adapter could be displaced in the equipment. This is particularly likely to occur if the support is rotated at high speed, as this is sometimes required in some processing or inspection steps.

In addition, the support of the various equipment composing a manufacturing line, vacuum chucks and vacuum end effectors, all have suction channels that may differ in size, shape and distribution over the receiving surface of the support. Obtaining alignment of the adapter through holes with a suction channel of the support may not be possible for all types of supports.

BRIEF SUMMARY

A purpose of the present disclosure is to resolve, at least partially, the aforementioned problems.

To this effect, the present disclosure relates to an adapter for retaining a substrate on a support of an equipment, the substrate having a substrate dimension not compatible with the support, the adapter having a front side to receive the substrate and a back side opposite the front side, the adapter back side being intended to be placed on, and to extend over, a main face of the support, the main face of the support comprising a first suction channel and a second suction channel, the adapter comprising:
  at least one shallow recess disposed on the front side to receive a substrate, the shallow recess being shaped to the substrate dimension and having a flat base to contact a surface of the substrate,
  a vacuum network extending through the adapter and comprising at least one through-passage connecting the adapter back side and the adapter front side, the through-passage opening out, on the front side, in the shallow recess and intercepting, on the back side, the first suction channel of the support, the vacuum network being configured to not intercept the second suction channel of the support, the adapter back side being arranged to face the second suction channel.

According to further non limitative features of the present disclosure, either taken alone or in any technically feasible combination:
  the at least one through-passage comprises at least one through-bore;
  the at least one through-passage comprises primary through-bores regularly arranged on the flat base along a circle centered in the shallow recess;
  the at least one through-passage comprises a first groove arranged on the flat base of the shallow recess and at least one central through-bore opening out into the first groove;
  the at least one through-passage comprises at least one connecting recess extending from a first zone to a second zone of the adapter back side, the first zone facing the shallow recess and the second zone being arranged to intercept the first suction channel of the support;
  the at least one through-passage further comprises a second groove arranged on the flat base of the shallow recess, the second groove being connected to the connecting recess;
  the shallow recess has a depth, between the front side and the flat base, the depth being intended to be less than a thickness of the substrate, preferably between 50 microns to 300 microns;
  shallow recess has a contour inclined with respect to the flat base by an angle greater than 90°, preferably between 90° and 150°;
  the shallow recess has a radial extension, so as to expose an edge of the substrate and facilitate gripping of the substrate.
  the most radial portion of the extension has an inclined ramp forming an angle with respect to a bottom of the radial extension greater than 90°, preferably between 110° and 160°;
  the back side comprises a flat surface arranged to face the second suction channel of the support;
  the adapter comprises a plurality of shallow recesses to receive a plurality of substrates.

According to another aspect, the present disclosure relates to a kit comprising an adapter according to any preceding claims and a support comprising a main face, a first suction channel and a second suction channel disposed on the main face, the first and second suction channels being independent from each other.

According to further non limitative features of this aspect of the present disclosure the support is rotatable around a rotational axis perpendicular to the main face. The first suction channel and the second suction channel may be arranged annularly on the main face of the support, the first suction channel being disposed within the internal zone defined by the second suction channel.

BRIEF DESCRIPTION OF THE DRAWINGS

Many other features and advantages of embodiments of the present disclosure will become apparent from reading the following detailed description, when considered in conjunction with the accompanying drawings, in which.

DETAILED DESCRIPTION

Figure 1A:
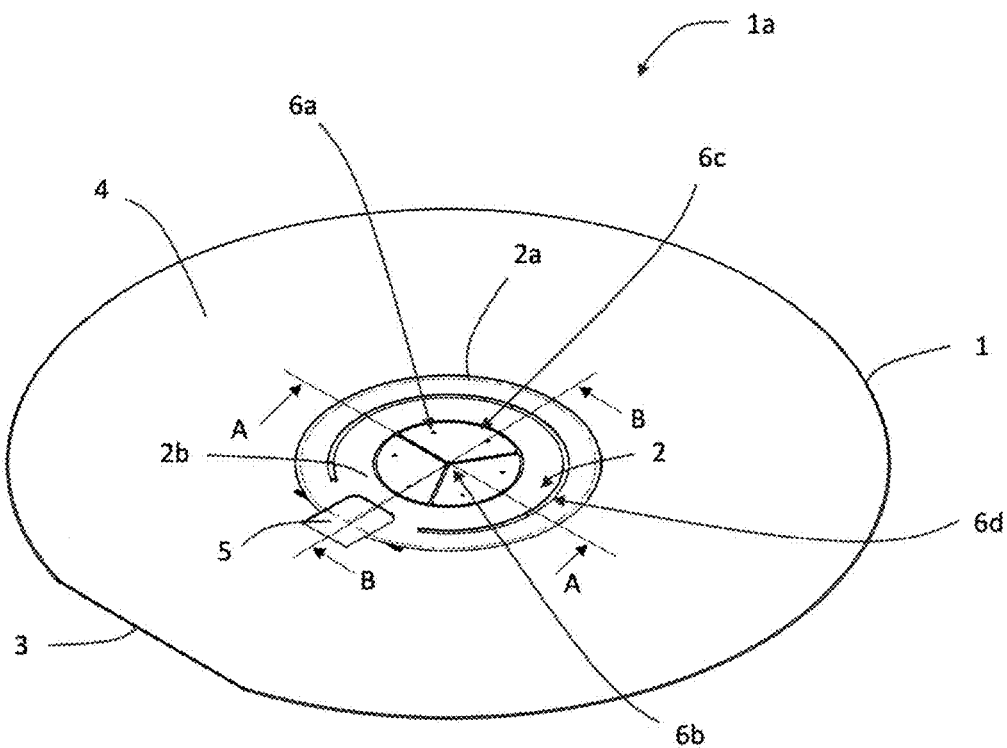
FIGS. 1A and 1B represent, respectively, a view of a front side and a view of a back side of an adapter according to an embodiment.

The following embodiments of the present disclosure describe a substrate dimension adapter or a wafer size adapter more particularly designed to support a wafer during an optical inspection stage in a semiconductor device production line.

Of course, other embodiments of the present disclosure are possible, to hold semiconductor substrates of shapes and nature different from wafers in any kind of semiconductor equipment.

Conventionally, in such an optical inspection stage, the wafer to be inspected is removed from a cassette by a handler comprising an articulated arm provided with a vacuum end effector. The handler arm is controlled to position the vacuum end effector in the cassette, under the back side of the wafer. The wafer is lifted by the end effector, removed from the cassette and positioned on the vacuum chuck of a pre-aligner.

Once accurately positioned and orientated by the pre-aligner, the wafer is lifted by the handler and disposed on the vacuum chuck of an optical inspection system. In the optical inspection system, the chuck is usually moved at high speed, or with strong accelerations. It can, for instance, be rotated at high speed, or moved along a raster scan trajectory, to have a laser beam scanning the exposed surface of the wafer, for instance, for detecting defects such as particles or scratches.

In such case, it is important during optical inspection to hold the wafer in a fixed position on its chuck. It is also important not to deform the wafer while it is held on the chuck, to ensure that the inspection equipment operates correctly, even with a very small depth of field.

After inspection, the wafer is replaced into the cassette, by the handler.

While the wafer is displaced by the handler or while it is residing on the pre-aligner chuck or on the optical inspection chuck, the wafer is maintained in position by vacuum. To this effect, and as this is well known, the supports (pre-aligner chuck, optical inspection chuck, end effector) have suction channels, such as holes or grooves arranged on the support surface receiving the back side of the wafer. Those features are open to the surface and depressurized in order to apply a suction force to the wafer so that it can be held firmly against the support. As it has been recalled in the introduction of the present disclosure, the disposition of the suction channels on the surface of the support may vary from one equipment to the other.

The wafer under inspection in the context of the present description generally has a size not compatible with the support of the optical inspection equipment, pre-aligner equipment, handler and/or cassette. It may be a wafer having a smaller size than the size for which such equipment is configured. For instance, the wafer may be disked shaped and have a diameter of 150 mm while the equipment is configured for handling 300 mm wafers. The wafer under inspection has a thickness of a few hundred microns, for instance, from 200 microns to 1 mm thick. The wafer under inspection may be made of any material, such as, for instance, silicon, sapphire, III-V materials (GaAs, GaN, InP) or be a composite wafer such as a silicon on insulator wafer.

To be able to process this wafer despite its incompatible size, the present disclosure proposes a wafer size adapter. The adapter has a shape and size compatible with the various pieces of equipment of the inspection stage and retain the wafer during the various processing step of the optical inspection stage, including its storage into the cassette.

The adapter has been designed to be compatible with a great variety of suction channels disposition. In some instances, however, and notably when both the adapter and the wafer under processing have to be firmly held onto the support, it is preferable to provide the support with at least two suction channels, as this will be made apparent in the following detailed description.

With reference to the figures, an adapter 1 according to the present description is plate like shaped. It has a diameter that conforms to a standard in the semiconductor industry, for instance, 150 mm, 200 mm or 300 mm, and therefore is compatible with the transport system and support of semi-conductor processing equipment. The adapter represented on the figures comprises a flat 3, similar to a standard semiconductor wafer, so that the adapter 1 can be oriented properly. However, this is not an essential feature, and more generally an adapter 1 according to the present disclosure may have another type of orientation indicator, such as a notch, or may have no orientation indicator at all.

Figure 1B:
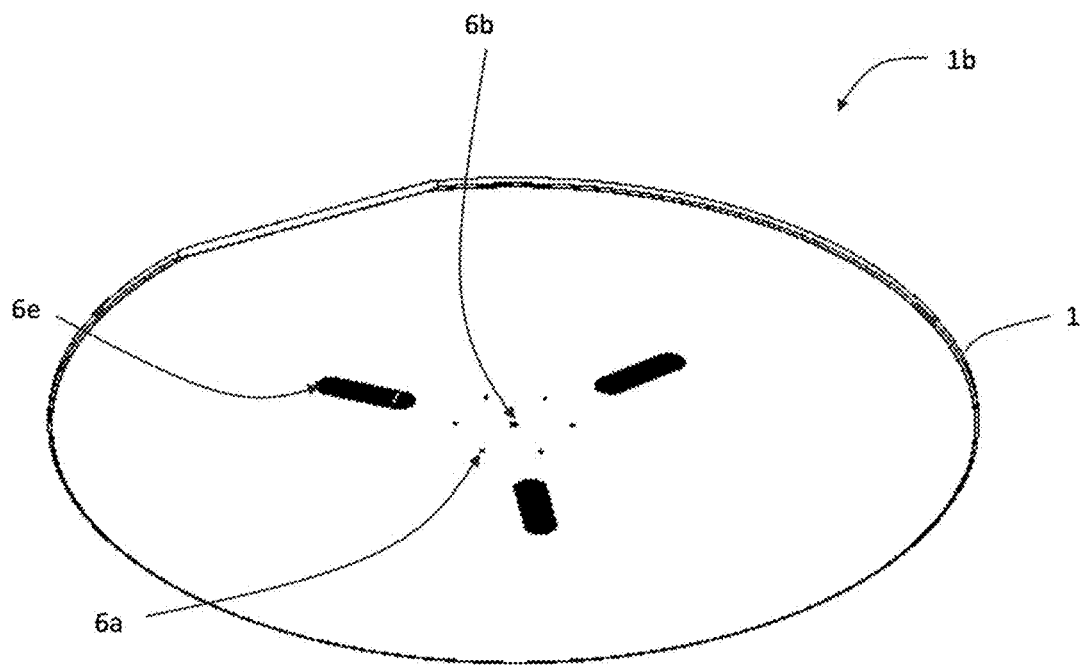

The adapter 1 has a front side 1a (represented in FIG. 1A) onto which the wafer under inspection is to be positioned and a back side 1b (represented in FIG. 1B), opposite the front side 1a, intended to be placed onto a main face of the support, in direct contact with this support.

The adapter thickness may be between 0.7 mm and a few millimeters, or, for instance, between 1 mm and 2 mm. When the wafer under inspection is positioned on the adapter 1, their combined thickness should not be excessive, such that they can be stored in and retrieved from the cassette and handled by the equipment composing the optical inspection stage. Wafer spacing in a cassette typically ranges from a few mm to 10 mm, or to 20 mm.

The adapter 1 is made of a rigid material, such as a ceramic or a metal, and provides a flat surface for receiving the wafer without imparting deformation to the wafer.

The adapter 1 comprises at least one shallow recess 2 disposed on the front side 1a to receive the wafer under inspection. The shallow recess 2 is surrounded by a generally annular flat surface 4 to define the adapter front side 1a. The adapter may be provided with a plurality of shallow recesses 2 disposed on its front side 1a to receive a plurality of substrates W.

Figure 1C:
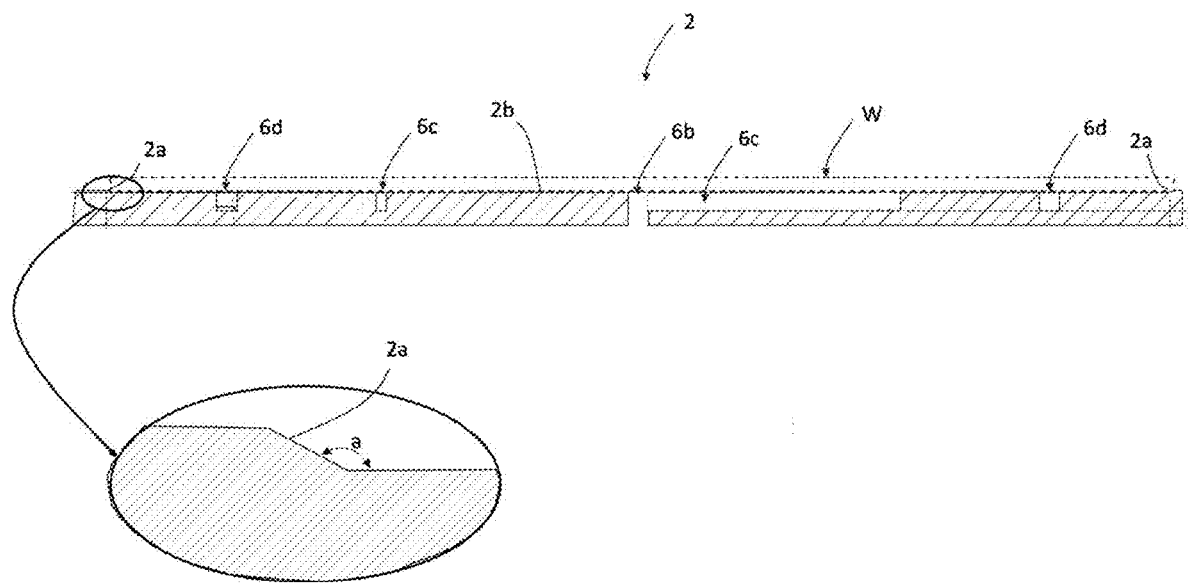
FIG. 1C is a cross section of the adapter of FIGS. 1A, 1B along the axis AA.

The shallow recess 2 is shaped to the size of the wafer under inspection W. Hence, the shallow recess 2 has a contour 2a that corresponds (e.g., is slightly larger) to the outer dimension of this wafer W. The shallow recess 2 is also comprising a flat base 2b to contact and support the wafer under inspection W when it has been properly positioned in the shallow recess 2. As this can be better seen on the insert of FIG. 1C, the contour 2a is inclined with respect to the flat base 2b by an angle "a" greater than 90°, typically between 90° and 150°, preferably 120°. The flat base 2b is contacting the back side of the wafer under inspection W over an extended surface (at least 80% of the back side surface, preferably at least 90%), such that this wafer is not deformed while it is maintained against the adapted 1. This is particularly important to make sure that optical measurements that may be performed on the front side of the wafer W are reliable.

The depth of the shallow recess, i.e., the difference in elevation between the flat base 2b and annular flat surface 4 is preferably less than the thickness of the wafer under inspection W. For instance, the depth of the shallow recess may be between 50 microns to 300 microns, preferably between 75 microns and 150 microns, when the wafer under inspection thickness ranges between 200 microns and 1 mm.

Figure 1D:
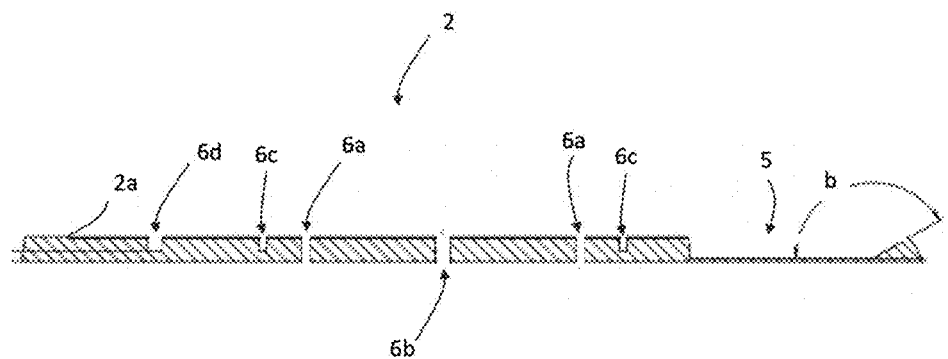
FIG. 1D is a cross section of the adapter of FIGS. 1A, 1B along the axis BB.

The adapter 1 also comprises a deep recess forming a radial extension 5 of the shallow recess 2. The radial extension has a depth greater than the shallow recess 2. Consequently, when the wafer under inspection W is placed into the shallow recess 2, an edge and a portion of the wafer back side are exposed to facilitate its gripping by a gripping tool. As it can be seen on FIG. 1D, the most radial portion of the radial extension 5 may be designed as an inclined ramp, the ramp forming an angle "b" with respect to the bottom of the radial extension 5. The angle b is greater than 90°, preferably between 110° and 160, for instance, 150°. The radial extension 5 may extend radially in the shallow recess over one third of the wafer under inspection radius. Its width may correspond to the width of the wafer under inspection orientation indicator, such as a flat.

The adapter 1 also comprises a network of through-passages extending through its thickness and opening out on its front side 1a and on its back side 1b. The network comprises at least one through-passage connecting the adapter back side 1b and the adapter front side 1a, the at least one through-passage opening out, on the front side 1a, in the shallow recess 2. The network of through-passages is designed to intercept, on the back side 1b, at least one suction channel of the support. When the wafer to be inspected W is properly placed onto the adapter 1, and both elements placed onto a support, a suction channel of the support may be located under the shallow recess 2 or under the annular flat surface 4. Advantageously, the network of through-passage is designed such that the through-passages are opening out, on the adapter back side 1b, to intercept a suction channel of the support located under the shallow recess 2 and/or under the annular flat surface 4.

In the adapter 1 of the present description, the network comprises through-passages in the form of primary through-bores 6a regularly disposed, 60° apart from each other, on a circle centered in the shallow recess 2. The through-bore are disposed in the flat base 2b of the shallow recess 2 and are therefore adapted to intercept suction channels disposed in the support, directly under the shallow recess 2.

The adapter 1 also comprises a through-passage in the form of a central through-bore 6b, centered in the shallow recess 2 and a first groove 6c arranged on the flat base 2b of the shallow recess 2. The first groove opens out on the front side 1a only and does not extend to the back side 1b. Its depth may correspond to half of the flat base 2b thickness. The central through-bore 6b is also adapted to intercept a suction channel disposed in the support directly under the shallow recess 2. The central through-bore 6b opens out into the first groove 6c. The first groove 6c comprises a circular portion, centered in the shallow recess 2. The diameter of the first groove 6c is such that it surrounds the primary through-bores 6a. The first groove 6c also comprises radial portions, here three radial portions evenly distributed and extending from the central through-bore 6b to the circular portion of the first groove. The first groove 6c allows distribution of the suction force on the back side of the wafer under inspection.

The adapter also comprises through-passages comprising a second groove 6d and connecting recesses 6e. The second groove 6d arranged and opening out on the flat base 2b of the shallow recess 2. As this can be seen on FIG. 1B, connecting recesses 6e are provided on the back side 1b of the adapter 1. At least one connecting recess 6e is extending radially from a first zone to a second zone of the adapter back side 1b. The first zone is facing the shallow recess 2 disposed on the opposite front side 1a. The connecting recess 6e and the second groove 6d are connected to each other in the first zone, hence forming a through-passage across the adapter 1. The second zone is radially positioned outward with respect to the first zone. The at least one connecting recess 6e allow to intercept a suction channel of the support that may be disposed directly under the annular flat surface 4, and not directly under the shallow recess 2.

In some instances, in particular, when the support is having slow movements, the wafer under inspection and the adapter 1 may be held by the support provided with a single suction channel. This notably happen when the adapter 1 and the wafer under inspection is held on the end effector or on the pre-aligner chuck. This single suction channel may be arranged to open out, on the support surface, as a central hole facing, for instance, the central through-bore 6b. As mentioned above, when partial vacuum is applied to the suction channel, it expands through the central through-bore 6b and in the first groove 6c, to apply suction forces to the wafer under inspection W and firmly hold this wafer and the adapter 1 against the support. Alternatively, the single suction channel may be arranged to open out, on the support main face, as holes or a circular groove or disk facing the primary through-bores 6a.

In other instances, and, in particular, when the support is having fast movements, for instance, when the wafer under inspection and the adapter 1 are held by the optical inspection chuck set in rotation at high speed, it is preferable to provide this support with at least two suction channels. A first suction channel is arranged to intercept one through-passage of the vacuum network of the adapter 1. This allows to hold the wafer against the adapter 1. A second suction channel is arranged on the support such that it does not intercept the vacuum network. The adapter back side 1b is arranged to face the second suction channel. This allows to hold the adapter 1 against the support. The two suction channels are advantageously independent from each other, this means that when the vacuum is broken or ineffective in one of the channel, this does not affect excessively the vacuum in the other channel, such that the suction forces applied by this other channel is sufficient to hold the wafer under inspection against the adapter 1 or the adapter against the support, as the case may be. For example, if the wafer W is wrongly positioned in the adapter 1 so that the suction by the first suction channel is not efficient enough to maintain it firmly in the adapter, the adapter 1 can still be firmly maintained on the support thanks to the second suction channel. So, the risks of damages of the instrument are reduced. This may be obtained by having two separate vacuum lines for each channel or providing sufficient vacuum in the line.

Figure 2A:
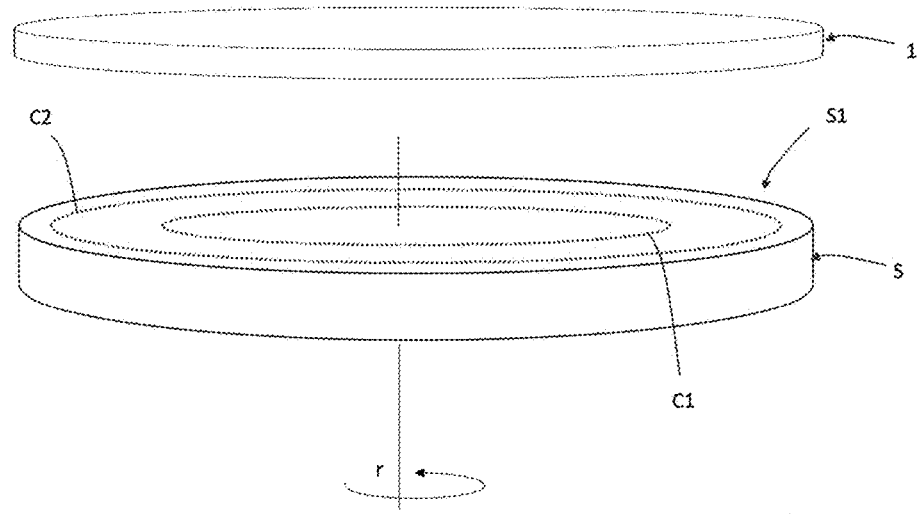
FIG. 2A illustrates a kit formed of an adapter and a support, according to an embodiment of the present disclosure.
Figure 2B:
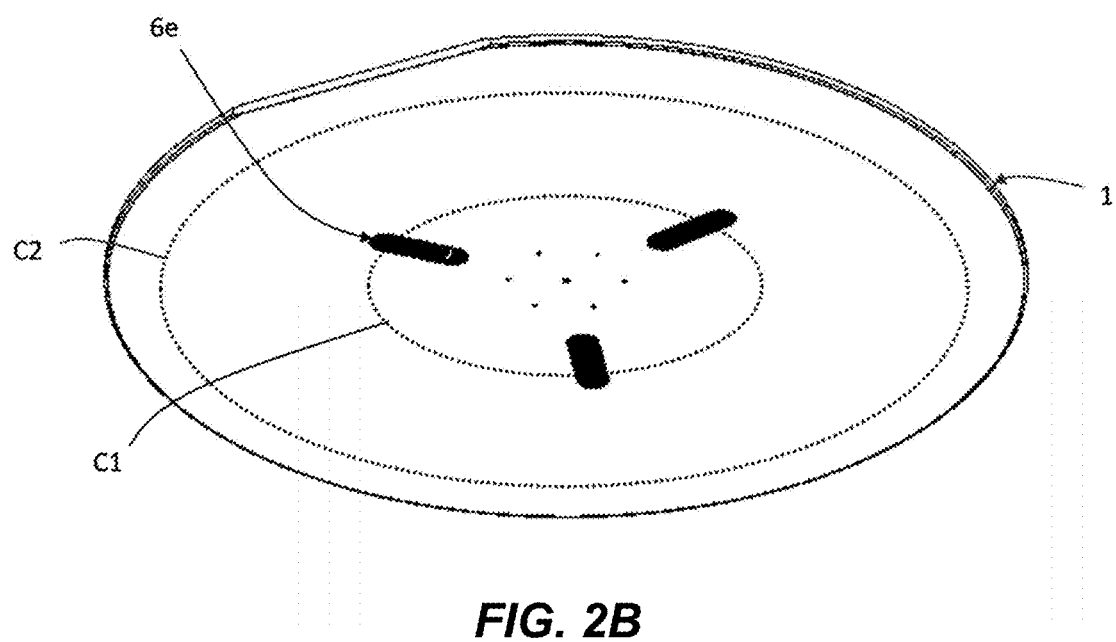
FIG. 2B is a view of a back side of the adapter in the preferred embodiment of FIG. 2A.

FIGS. 2A and 2B illustrate such a preferred configuration. On FIG. 2A, a support S, for instance, the vacuum chuck of an optical inspection equipment, is provided with a first suction channel C1 and second suction channel C2. The support S is rotatable around a rotational axis r perpendicular to its main face S1. For the purpose of illustration, this first suction channel C1 opens out on the main face S1 of the support S as plurality of holes disposed in a first centered circle. The first suction channel may form a first vacuum line, associated with a first vacuum pump. The second suction channel C2 opens out on the main face S1 of the support S as plurality of holes disposed in a second circle, having a diameter greater from the diameter of the first circle. Said differently, the first suction channel C1 and the second suction channel C2 are arranged annularly on the main face S1 of the support, the first suction channel C1 being disposed within the internal zone defined by the second suction channel C2. The second suction channel C2 may form a second vacuum line, preferably associated with a second vacuum pump, different from the first vacuum pump. As mentioned above, the first and second suction channels C1, C2 may be associated to the same vacuum pump to the extent that the vacuum level is sufficient to preserve the suction force applied by one channel, when the vacuum is broken or defective in the other channel, or if the system comprises a valve system to prevent loss of vacuum in both channels.

As it is apparent on FIG. 2B, the vacuum network of the adapter 1 is designed so as to intercept the first suction channel C1 via the through-passage formed by the connecting recess 6e connected to the second groove 6d formed in the shallow recess 2 of the adapter 1. None of the through-passages of the vacuum network of the adapter 1 is intercepting the second suction channel C2. Moreover, the adapter 1 is preferably designed so that the second suction channel C2 of the support S is facing a flat surface of that adapter back side 1b, to optimize the efficiency of the vacuum suction. So, that second suction channel C2 is used to solely apply a suction force to the adapter 1, regardless of the presence or the position of the wafer under inspection.

Other variations to the disclosed embodiments can be understood and effected by those skilled in the art in practicing the claimed disclosure, from a study of the drawings, the disclosure, and the appended claims.

In particular, and as already mentioned in a preceding passage of this description, the adapter of the present disclosure can be designed to hold semiconductor substrates of any shape, such as circular wafers, or panels or dies of a rectangular or square shape. It can, for example, be designed to hold:

wafers of a smaller size on a holding element such as a chuck designed for wafers of larger size;

rectangular panels of a smaller size on a holding element such as a chuck designed for panels or wafers of larger size;

dies (semiconductor circuits elements) on a holding element such as a chuck designed for panels or wafers of larger size.

What is claimed is:

1. An adapter for retaining a substrate on a support of an equipment, the substrate having a substrate dimension not compatible with the support, the adapter having a front side to receive the substrate and a back side opposite the front side, the adapter back side being configured to be placed on, and to extend over, a main face of the support, the main face of the support comprising a first suction channel and a second suction channel, the adapter comprising:

at least one shallow recess disposed on the front side to receive a substrate, the shallow recess being shaped to the substrate dimension and having a flat base to contact a surface of the substrate; and a vacuum network extending through the adapter and comprising at least one through-passage connecting the adapter back side and the adapter front side, the through-passage opening out, on the front side, in the shallow recess and intercepting, on the back side, the first suction channel of the support, the vacuum network being configured to not intercept the second suction channel of the support, the adapter back side being arranged to face the second suction channel.

2. The adapter of claim 1, wherein the at least one through-passage comprises at least one through-bore.

3. The adapter of claim 1, wherein the at least one through-passage comprises primary through-bores regularly arranged on the flat base along a circle centered in the shallow recess.

4. The adapter of claim 1, wherein the at least one through-passage comprises a first groove arranged on the flat base of the shallow recess and at least one central through-bore opening out into the first groove.

5. The adapter of claim 1, wherein the at least one through-passage comprises at least one connecting recess extending from a first zone to a second zone of the adapter back side, the first zone facing the shallow recess and the second zone being configured to intercept the first suction channel of the support.

6. The adapter of claim 5, wherein the at least one through-passage further comprises a second groove arranged on the flat base of the shallow recess, the second groove being connected to the connecting recess.

7. The adapter of claim 1, wherein the shallow recess has a depth, between the front side and the flat base, the depth configured to be less than a thickness of the substrate.

8. The adapter of claim 7, wherein the depth is in a range extending from 50 microns to 300 microns.

9. The adapter of claim 1, wherein the shallow recess has a contour inclined with respect to the flat base by an angle greater than 90°.

10. The adapter of claim 9, wherein the angle is between 90° and 150°.

11. The adapter of claim 1, wherein the shallow recess has a radial extension to expose an edge of the substrate and facilitate gripping of the substrate.

12. The adapter of claim 11, wherein the most radial portion of the extension has an inclined ramp forming an angle with respect to a bottom of the radial extension greater than 90°.

13. The adapter of claim 12, wherein the angle is between 110° and 160°.

14. The adapter of claim 1, wherein the back side comprises a flat surface arranged to face the second suction channel of the support.

15. The adapter of claim 1, further comprising a plurality of shallow recesses to receive a plurality of substrates.

16. A kit comprising an adapter according to claim 1 and a support comprising a main face, a first suction channel and a second suction channel disposed on the main face, the first and second suction channels being independent from each other.

17. The kit of claim 16, wherein the support is rotatable around a rotational axis perpendicular to the main face.

18. The kit according to claim 16, wherein the first suction channel and the second suction channel are arranged annularly on the main face of the support, the first suction channel being disposed within the internal zone defined by the second suction channel.

\* \* \* \* \*